United States Patent
Matsushita et al.

(10) Patent No.: US 10,404,033 B2
(45) Date of Patent: *Sep. 3, 2019

(54) LIGHT-EMITTING DEVICE AND PACKAGE FOR LIGHT-EMITTING DEVICE

(71) Applicants: NICHIA CORPORATION, Anan-shi, Tokushima (JP); SHINKO ELECTRIC INDUSTRIES CO., LTD., Nagano-shi, Nagano (JP)

(72) Inventors: Shigeru Matsushita, Nagano (JP); Katsuya Nakazawa, Nagano (JP); Eiichiro Okahisa, Tokushima (JP); Kazuma Kozuru, Tokushima (JP)

(73) Assignees: NICHIA CORPORATION, Anan-shi (JP); SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/966,847

(22) Filed: Apr. 30, 2018

(65) Prior Publication Data
US 2018/0254604 A1 Sep. 6, 2018

Related U.S. Application Data

(63) Continuation of application No. 15/598,182, filed on May 17, 2017, now Pat. No. 9,985,411.

(30) Foreign Application Priority Data

May 19, 2016 (JP) .................................. 2016-100651

(51) Int. Cl.
*H01S 5/00* (2006.01)
*H01S 5/022* (2006.01)
(Continued)

(52) U.S. Cl.
CPC .......... *H01S 5/022* (2013.01); *H01L 25/0753* (2013.01); *H01L 33/486* (2013.01);
(Continued)

(58) Field of Classification Search
CPC .... H01S 5/4025; H01S 5/005; H01S 5/02216; H01S 5/02272; H01S 5/02469;
(Continued)

(56) References Cited

U.S. PATENT DOCUMENTS 9,516,770 B2 12/2016 Kanchiku
9,985,411 B2 * 5/2018 Matsushita ......... H01S 5/02216
(Continued)

FOREIGN PATENT DOCUMENTS

CN 201887043 U 6/2011
DE 20 2010 016 257 U1 2/2011
(Continued)

OTHER PUBLICATIONS

Notice of Allowance for U.S. Appl. No. 15/598,182 dated Feb. 7, 2018.

*Primary Examiner* — Kinam Park
(74) *Attorney, Agent, or Firm* — Foley & Lardner LLP

(57) ABSTRACT

A light-emitting device includes a base body; light-emitting elements mounted on an upper surface of the base body; a frame body bonded to the upper surface of the base body, the frame body including inner lateral surfaces, outer lateral surfaces, and first through-holes that extend through the frame body in a lateral direction; lead terminals that extend through the first through-holes, and each of which is electrically connected to the light-emitting elements; a cover bonded to the frame body; plate bodies bonded to an outer lateral surface or inner lateral surface of the frame body, each of the plate bodies having one or more second through-holes, wherein each of the lead terminals extends through a
(Continued)

respective through-hole; and fixing members, each of which is disposed in a second through-hole and fixes a respective one of the one or more lead terminals.

20 Claims, 9 Drawing Sheets

(51) Int. Cl.
*H01S 5/024* (2006.01)
*H01S 5/30* (2006.01)
*H01S 5/40* (2006.01)
*H01L 25/075* (2006.01)
*H01L 33/48* (2010.01)
*H01L 33/60* (2010.01)
*H01L 33/62* (2010.01)
*H01L 33/64* (2010.01)

(52) U.S. Cl.
CPC .............. *H01L 33/60* (2013.01); *H01L 33/62* (2013.01); *H01S 5/02216* (2013.01); *H01S 5/02256* (2013.01); *H01S 5/02272* (2013.01); *H01S 5/02276* (2013.01); *H01S 5/02292* (2013.01); *H01S 5/02469* (2013.01); *H01S 5/3013* (2013.01); *H01S 5/4025* (2013.01); *H01L 33/642* (2013.01); *H01L 33/644* (2013.01); *H01L 2224/48091* (2013.01); *H01L 2224/48137* (2013.01)

(58) Field of Classification Search
CPC .... H01S 5/3013; H01S 5/022; H01S 5/02292; H01S 5/02256
See application file for complete search history.

(56) References Cited

U.S. PATENT DOCUMENTS

| | | | |
|---|---|---|---|
| 2009/0146288 A1* | 6/2009 | Mishima | G11B 7/127 257/698 |
| 2011/0080928 A1* | 4/2011 | Yoshikawa | H01S 5/02244 372/43.01 |
| 2011/0186880 A1 | 8/2011 | Kohler et al. | |
| 2012/0133268 A1 | 5/2012 | Hwu et al. | |
| 2012/0320938 A1* | 12/2012 | Takenaka | G02B 6/4265 372/36 |
| 2013/0272329 A1 | 10/2013 | Auen et al. | |
| 2015/0189775 A1* | 7/2015 | Kanchiku | H01R 13/405 361/807 |
| 2015/0355533 A1* | 12/2015 | Masuda | G03B 21/204 353/52 |
| 2017/0047486 A1 | 2/2017 | Herrmann et al. | |
| 2017/0229841 A1* | 8/2017 | Hettler | H01S 5/02216 |

FOREIGN PATENT DOCUMENTS

| | | |
|---|---|---|
| DE | 10 2014 105 839 A1 | 10/2015 |
| JP | H04-179254 A | 6/1992 |
| JP | H-0897320 A | 4/1996 |
| JP | 2004-228535 A | 8/2004 |
| JP | 2011-049338 A | 3/2011 |
| JP | 2015-142014 A | 8/2015 |
| JP | 2015-159221 A | 9/2015 |
| JP | 2015-225873 A | 12/2015 |
| WO | WO-2014-083992 A1 | 6/2014 |

* cited by examiner

LIGHT-EMITTING DEVICE AND PACKAGE FOR LIGHT-EMITTING DEVICE

CROSS-REFERENCE TO RELATED APPLICATIONS

The present application is a continuation of U.S. patent application Ser. No. 15/598,182, filed on May 17, 2017, which claims priority to Japanese Patent Application No. 2016-100651, filed on May 19, 2016, the disclosures of which are hereby incorporated by reference in their entireties.

BACKGROUND

The present disclosure relates to a light-emitting device and a package for the light-emitting device.

A light-emitting device is known that includes a package having a base body, a frame body, and lead terminals which penetrate a side surface of the frame body, and in which a light-emitting element and the like are mounted on the package (refer to Japanese Patent Application Laid-open No. 2011-049338 or WO 2014/083992).

SUMMARY

In the case where a large number of light-emitting elements are arranged on such a package, due to heat generated by the light-emitting elements and the like, thermal stress may be applied to each member. Accordingly, detachment easily occurs at portions with relatively low bonding strength. For example, when a lead terminal is bonded to a through-hole of a frame body, which is portion with a relatively small area, the bonding strength at a periphery of the lead terminal is low and a gap is likely to be generated. The generation of such gaps may cause a decline in airtightness of the light-emitting device.

Certain embodiments of the present invention are described below.

In one embodiment, light-emitting device includes: a base body including an upper surface and a lower surface; at least one light-emitting element mounted on the upper surface of the base body; a frame body bonded to the upper surface of the base body so as to surround the at least one light-emitting element, the frame body having at least one inner lateral surface, at least one outer lateral surface, and at least one first through-hole that penetrates the frame body so as to connect an inside and an outside of the frame body; at least one lead terminal each inserted into the at least one first through-hole, the at least one lead terminal electrically connected to the at least one light-emitting element; a cover bonded to the frame body so as to seal the at least one light-emitting element; at least one plate body each bonded to at least one of the at least one outer lateral surface and the at least one inner lateral surface of the frame body, the at least one plate body each having at least one second through-hole that penetrates the plate body in a direction that is the same as a penetrating direction of the at least one first through-hole, each of the at least one lead terminal inserted into each of the at least one second through-hole, the at least one one plate body having a thickness greater than a thickness of the frame body; and at least one fixing member each disposed in each of the at least one second through-hole, each of the at least one fixing member fixing each of the at least one lead terminal.

In another embodiment, a package for a light-emitting device includes: a base body including an upper surface and a lower surface; a frame body bonded to the upper surface of the base body, the frame body including at least one outer lateral surfaces, at least one inner lateral surfaces, and at least one first through-holes that penetrate the frame body so as to connect an inside and an outside of the frame body; at least one lead terminal each inserted into each of the at least one first through-hole; at least one plate body bonded to at least one of the at least one outer lateral surface and the at least one inner lateral surface of the frame body, the at least one plate body each having at least one second through-hole that penetrates the plate body in a direction that is the same as a penetrating direction of the at least one first through-hole, each of the at least one lead terminal inserted into each of the at least one second through-hole, the at least one plate body each having a thickness larger than a thickness of the frame body; and at least one fixing member each disposed in each of the at least one second through-hole, each of the at least one fixing member fixing each of the at least one lead terminal.

With the configurations above, a relatively inexpensive light-emitting device and a package for the light-emitting device can be provided in which airtightness is not easily decreased.

DETAILED DESCRIPTION

Figure 1A:
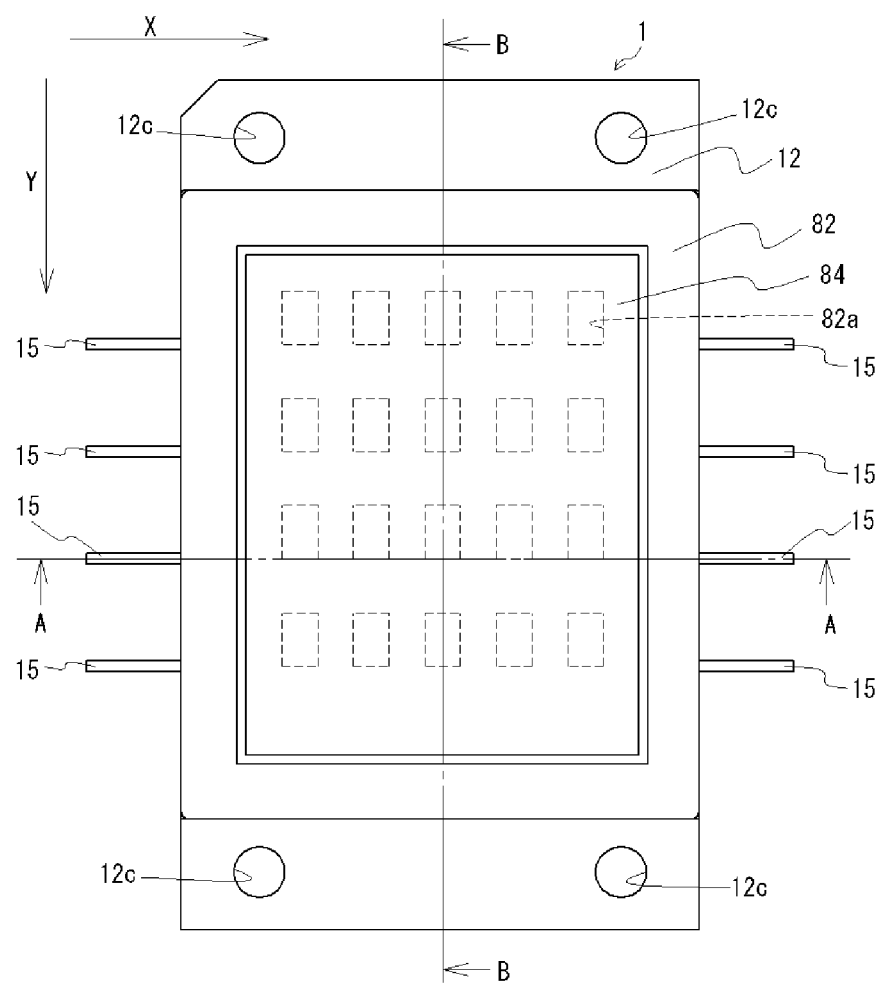
FIG. 1A is a schematic plan view of a light-emitting device according to an embodiment.
Figure 1B:
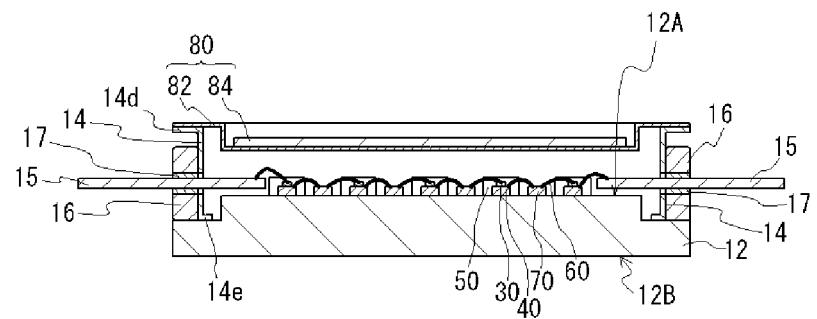
FIG. 1B is a schematic sectional view taken along line A-A in FIG. 1A.
Figure 1C:
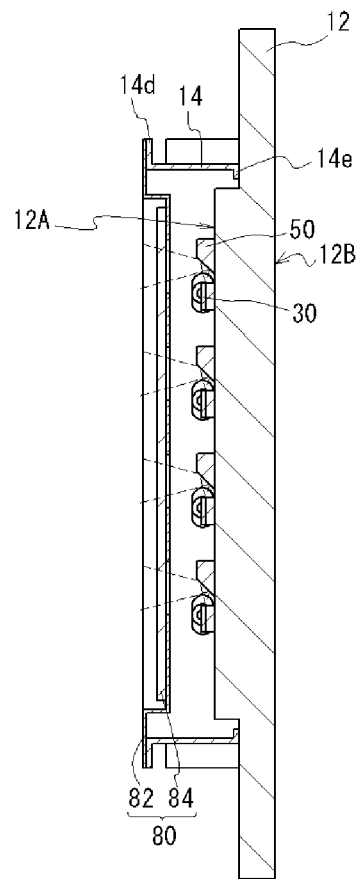
FIG. 1C is a schematic sectional view taken along line B-B in FIG. 1A.
Figure 1D:
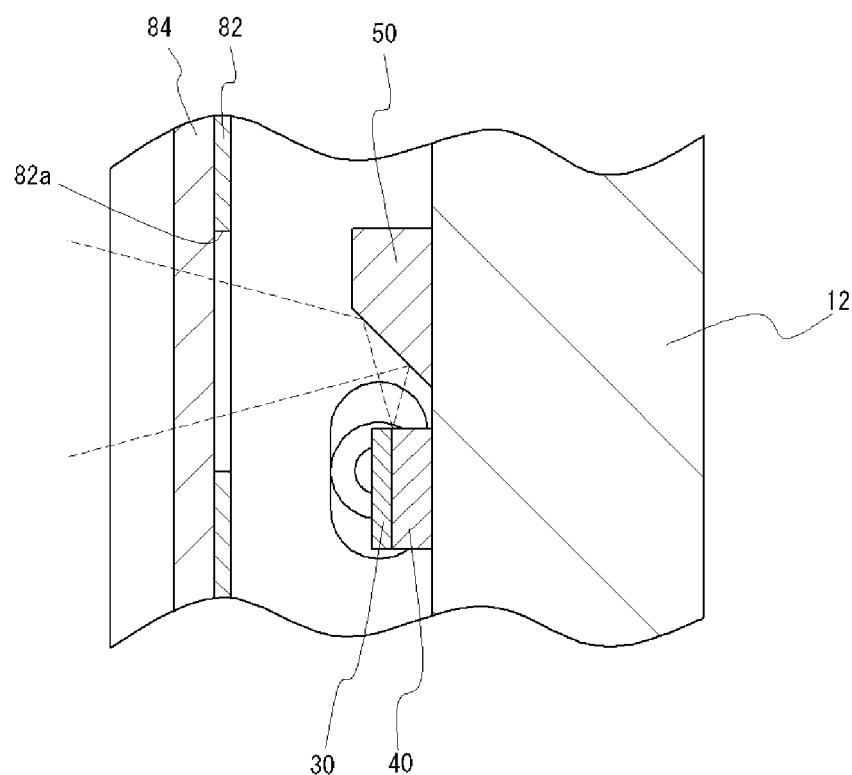
FIG. 1D is a partial enlarged view of FIG. 1C.
Figure 2A:
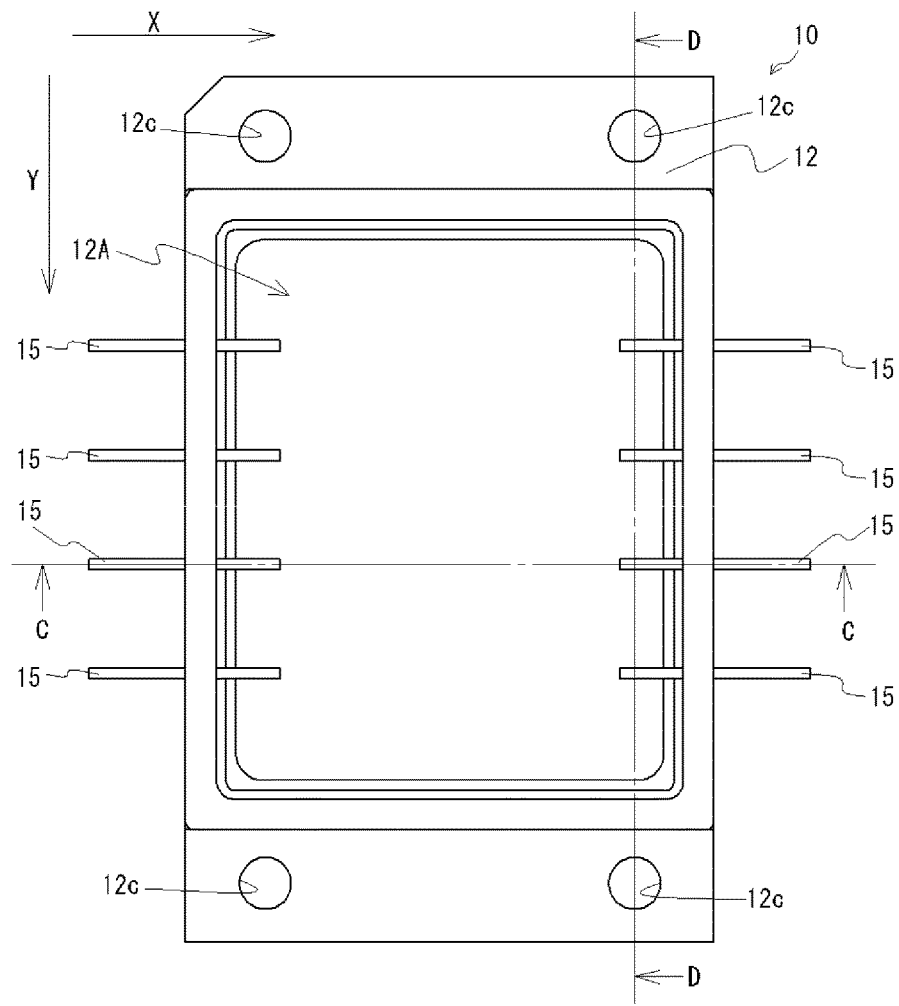
FIG. 2A is a schematic plan view of a package according to an embodiment.
Figure 2B:
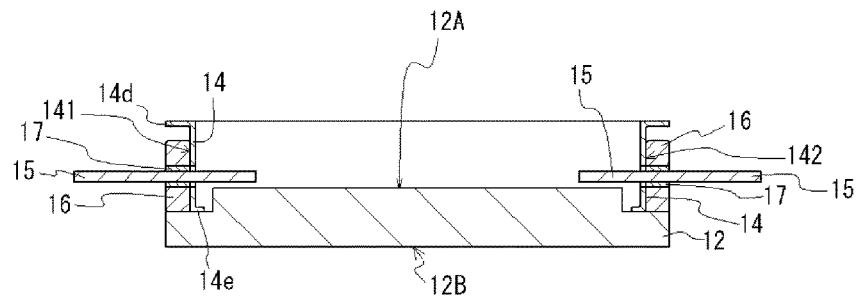
FIG. 2B is a schematic sectional view taken along line C-C in FIG. 2A.
Figure 2C:
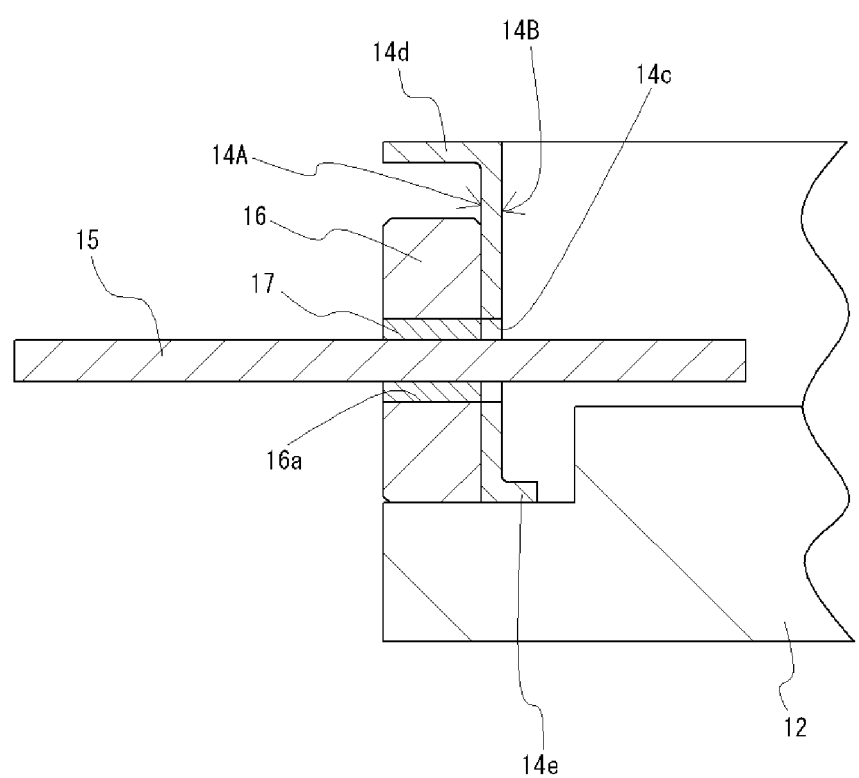
FIG. 2C is a partial enlarged view of FIG. 2B.
Figure 2D:
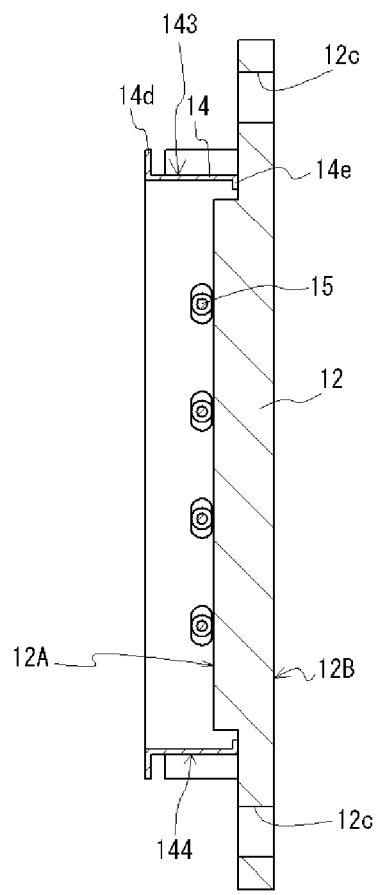
FIG. 2D is a schematic sectional view taken along line D-D in FIG. 2A.
Figure 3:
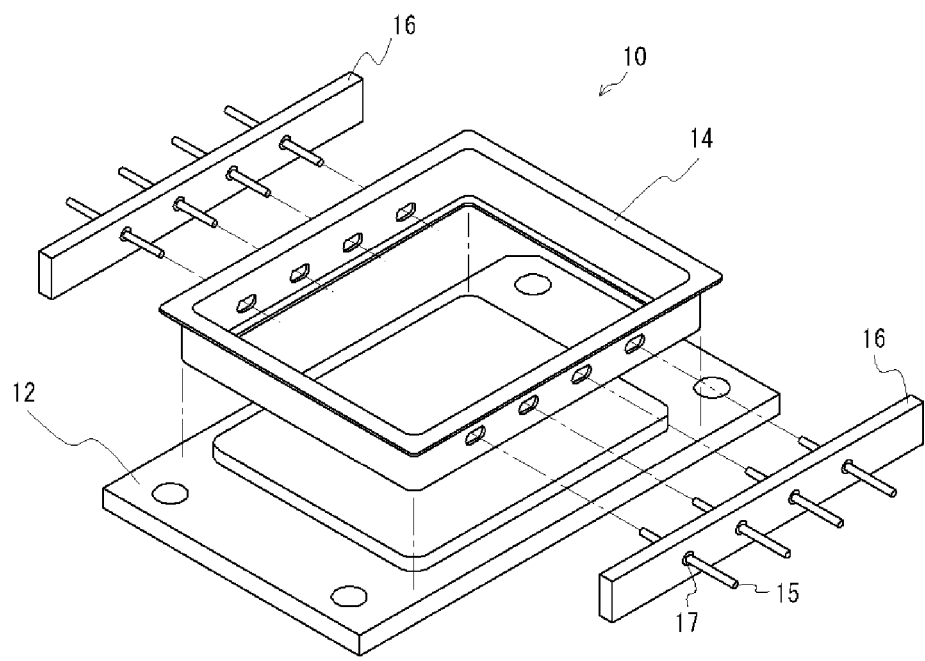
FIG. 3 is a schematic exploded perspective view of a package.

FIG. 1A is a schematic plan view of a light-emitting device 1 according to one embodiment. FIG. 1B is a sectional view taken along a line A-A in FIG. 1A, FIG. 1C is a sectional view taken along a line B-B in FIG. 1A, and FIG. 1D is a partial enlarged view showing an enlargement of a portion of FIG. 1C. In addition, FIG. 2A is a schematic plan view of a package 10 used in the light-emitting device 1. FIG. 2B is a sectional view taken along a line C-C in FIG. 2A and FIG. 2C is a partial enlarged view showing an enlargement of a portion of FIG. 2B. FIG. 2D is a schematic sectional view taken along a line D-D in FIG. 2A. Furthermore, FIG. 3 is a schematic exploded perspective view of the package 10.

As shown in FIGS. 1A to 3, the light-emitting device 1 includes a base body 12, light-emitting elements 30, a frame body 14, lead terminals 15, and a cover 80. The base body 12 includes an upper surface 12A and a lower surface 12B. The light-emitting element 30 is mounted on the upper surface 12A of the base body 12. The frame body 14 is bonded to an upper surface 12A side of the base body 12 so as to surround the light-emitting elements 30. The frame body 14 includes first through-holes 14c that penetrate the frame body 14 so as to connect an inside and an outside of the frame body 14. The lead terminals 15 are each inserted into each of the first through-holes 14c and are electrically connected to the light-emitting elements 30. The cover 80 is bonded to the frame body 14 so as to seal the light-emitting elements 30. The light-emitting device 1 further includes plate bodies 16 and fixing members 17. The plate bodies 16 are bonded to outer lateral surfaces 14A of the frame body 14. Each of the plate bodies 16 includes second through-holes 16a which penetrate each of the plate bodies 16 in a direction same as a penetrating direction of the first through-holes 14c. Each of the lead terminals 15 is inserted into each of the second through-holes 16a, and the plate bodies 16 each has a thickness larger than a thickness of the frame body 14. The fixing members 17 are each disposed inside each of the second through-holes 16a and fix the lead terminals 15.

With the configuration described above, a relatively inexpensive light-emitting device 1 can be obtained in which airtightness is not easily decreased. A detailed description of this feature will be given below.

In the light-emitting device 1, energization is required for light emission of the light-emitting element. Such energization causes the light-emitting element 30 to generate heat, and the heat generated by the light-emitting element 30 is transmitted over the entire light-emitting device 1. In addition, at the time of bonding the light-emitting element 30 and the like using a bonding material, the entirety of the light-emitting device 1 may be heated in order to, for example, cure the bonding material. Because the light-emitting device 1 is constituted by various members with different thermal expansion coefficients, thermal stress is generated on each member when a temperature is changed. Due to thermal stress generated on each member, separation between each member may be occurred, and airtightness may be decreased.

For this reason, in the light-emitting device 1, the frame bodies 14 bonded to the base body 12 each have a thickness smaller than that of the plate body 16. With this arrangement, the thermal stress generated on the frame body 14 can be reduced due to deformation of the frame body 14. Furthermore, each of the lead terminals 15 is fixed by a fixing member in each of the second through-holes 16a defined in the plate body 16, which has a thickness greater than that of the frame body 14. In view of fixing of the lead terminals 15, each of the lead terminals may be fixed in respective one of the first through-holes 14c of the frame body 14. However, a thickness of the frame body 14 is reduced to facilitate deformation of the frame body 14, and accordingly, an area of an inner wall of each of the first through-holes 14c is also reduced. For this reason, it is difficult to hold the lead terminals 15 with the first through-holes 14c of the frame body 14 in an airtight manner. On the other hand, each of the plate bodies 16 has a thickness greater than that of the frame body 14, so that an area of an inner wall of the second through-hole 16a is larger than the area of the inner wall of the first through-hole 14c. Therefore, fixing each of the lead terminals 15 in each of the second through-holes 16a defined in the plate body 16 allows the lead terminals 15 to be fixed more firmly. For this reason, a decrease in airtightness of the light-emitting device 1 can be prevented. Since the plate bodies 16 are bonded to lateral surfaces of the frame body 14, the plate bodies 16 and the frame body 14 are bonded to each other via relatively large areas. Accordingly, the plate bodies 16 and the frame body 14 are not easily separated from each other and, even if a partial separation is occurred, the partial separation does not easily create a gap connecting an inside and an outside of a sealed space.

It may be assumed that airtightness can be secured without using the plate bodies by increasing a thickness of the frame body itself. However, increasing the thickness of the frame body itself may lead to not only increase in a manufacturing cost due to difficulty in manufacturing the frame body but also difficulty in deformation of the frame body itself, so that securing airtightness may be difficult. In consideration thereof, in the light-emitting device 1, the frame body 14 with a small thickness for releasing stress and the plate bodies 16 with a great thickness for fixing the lead terminals 15 are disposed as separate members, so that airtightness can be secured while achieving cost reduction.

In the description below, each member included in the light-emitting device 1 will be described.

Package 10

Figure 4:
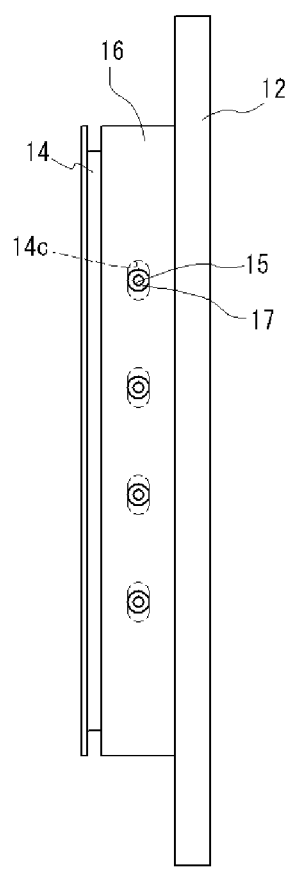
FIG. 4 is a schematic side view of a package.

As shown in FIGS. 2A to 3, the package 10 used in the light-emitting device 1 includes the base body 12, the frame body 14, the lead terminals 15, the plate bodies 16, and the fixing members 17. FIG. 4 shows a schematic side view of the package 10.

Base Body 12

The base body 12 is a member on which the light-emitting elements 30 and the like can be mounted. Typically, the lower surface 12B of the base body 12 is thermally connected to a heat sink or the like and serves as a heat radiation surface for dissipating heat of the light-emitting element 30. While the base body 12 may be a member with a flat plate shape, the base body 12 preferably has a protrusion that protrudes upward as shown in FIGS. 2B and 2D. The protrusion is formed at a position surrounded by the frame body 14, and a region corresponding to an upper surface of the protrusion in the upper surface 12A is to be used as a mounting surface on which the light-emitting element 30 and the like are mounted. With such a protrusion, a thickness of the base body 12 can be increased at a portion having the protrusion, and thus warpage of the base body 12 can be reduced. Further, members such as the light-emitting elements 30 may be arranged on the protrusion, which allows the members to be arranged close to the cover 80. With this arrangement, an optical path length of light emitted by the light-emitting elements 30 to the cover 80 can be shortened, so that a spread of light on a light incident surface of the cover 80 can be reduced.

A ceramic material or a metal material can be used for the base body 12. A metal material is preferably used in order to improve heat radiation. Examples of such a metal material include iron, iron alloys, copper, and copper alloys. In addition, one or more through-holes 12c for inserting screws may be defined in the base bodies 12. A plurality of the through-holes 12c may be defined in the base bodies 12, and by fitting a screw into each through-hole 12c, the base body 12 can be fixed to a heat sink or the like.

Frame Body 14

The frame body 14 is bonded to the upper surface 12A of the base body 12. A region surrounded by the frame body 14 serves as a region for mounting the light-emitting elements 30 and the like. The frame body 14 is bonded to the base body 12 so that bonding the cover 80 with the frame body 14 allows the light-emitting element 30 and the like to be hermetically sealed. In the package 10, the frame body 14 is bonded to surfaces of the base body 12 around the protrusion.

The lead terminals 15 need not be fixed to the frame body 14. Therefore, the frame body 14 can have a thickness smaller than a thickness of the plate body 16. The thickness of the frame body 14 can preferably be in a range of 0.1 to 1.0 mm, and more preferably in a range of 0.2 to 0.8 mm. The "thickness of the frame body 14" is, in other words, a distance between corresponding outer lateral surfaces 14A and inner lateral surfaces 14B. Because the lead terminals 15 need not be fixed to the frame body 14, an inexpensive material that can be easily processed can be used for the frame body 14. Accordingly, the cost of the package 10 can be reduced. Examples of a material of the frame body 14 include steel plate cold (SPC). Compared to KOVAR®, SPC can be more easily processed into a shape of the frame body 14 and can be manufactured more inexpensively.

As shown in FIG. 2C, among others, the frame body 14 includes an upper peripheral portion 14d that bends outward above the plate bodies 16. Because a thickness of the frame body 14 is reduced, if the frame body 14 does not have the upper peripheral portion 14d, a region for bonding the cover 80 to the frame body 14 cannot be secured and the cover 80 and the frame body 14 may not be firmly bonded to each other. In view of this, with the frame body 14 having the upper peripheral portion 14d bonded to the cover 80 via a relatively large area, the upper peripheral portion 14d and the cover 80 can be firmly bonded to each other. For example, the upper peripheral portion 14d may have a length in a range of 1.0 to 3.0 mm. In the present embodiment, the upper peripheral portion 14d bends outward in a direction approximately perpendicular with respect to the outer lateral surface 14A. The expression "bend outward" refers to bending along a direction from the inner lateral surfaces 14B toward the outer lateral surfaces 14A, and the expression "bend inward" refers to bending along a direction from the outer lateral surfaces 14A toward the inner lateral surfaces 14B. The frame body 14 can also have an upper peripheral portion that bends inward above the plate bodies 16.

As shown in FIG. 2C, among others, the upper peripheral portion 14d is preferably spaced from the plate bodies 16. With the upper peripheral portion 14d spaced from the plate bodies 16 and not in contact with the plate body 16, the frame body 14 can be more easily deformed at a portion in the vicinity of a bending part, so that stress applied to the cover 80 can be easily reduced.

In the package 10, as shown in FIG. 2C, the upper peripheral portion 14d is bent outward and the plate bodies 16 are bonded to the outer lateral surfaces 14A of the frame body 14. In this manner, with the arrangement of the plate bodies 16 below the upper peripheral portion 14d, upsizing of the package 10 can be prevented. For example, the upper peripheral portion 14d has a size that allows the upper peripheral portion 14d to cover and hide a large portion of the plate bodies 16 in a top view as shown in FIG. 2A.

Further, as shown in FIG. 2C, the frame body 14 includes a lower peripheral portion 14e that bends inward below the plate bodies 16. In this case, the frame body 14 is bonded to the base body 12 at the lower peripheral portion 14e. Accordingly, even with the frame body 14 with a small thickness, a bonding area between the frame body 14 and the base body 12 can be increased, so that the frame body 14 and the base body 12 can be more firmly bonded to each other. The frame body 14 and the base body 12 are bonded using a bonding material such as silver solder. A lower surface of the lower peripheral portion 14e may have an area smaller than an area of an upper surface of the upper peripheral portion 14d. In the present embodiment, the lower peripheral portion 14e bends inward in a direction approximately perpendicular with respect to the inner lateral surfaces 14B. The frame body 14 can also include a lower peripheral portion that bends outward below the plate body 16.

In the case where the frame body 14 includes both the upper peripheral portion 14d and the lower peripheral portion 14e, with the upper peripheral portion 14d and the lower peripheral portion 14e that are arranged in orientations different from each other, the frame body 14 can be manufactured more easily compared with the case where the upper peripheral portion 14d and the lower peripheral portion 14e are arranged in the same orientation. Therefore, for example, the upper peripheral portion 14d is preferably bent outward and the lower peripheral portion 14e is bent inward as in the present embodiment.

For example, the frame body 14 has an approximately rectangular outer shape in a top view, as shown in FIG. 2A. In this case, as shown in FIGS. 2B and 2D, the frame body 14 includes a first outer lateral surface 141, a second outer lateral surface 142, a third outer lateral surface 143, and a fourth outer lateral surface 144. The second outer lateral surface 142 is on an opposite side of the first outer lateral surface 141 and the fourth outer lateral surface 144 is on an opposite side of the third outer lateral surface 143. The expression "approximately rectangular shape" include a rectangular shape and a shapes created by rounding one or more corners of a rectangle. In the package 10, as shown in FIGS. 2A and 3, in a top view, the frame body 14 has a shape created by rounding all of the corners of a rectangle. In the package 10, the plate bodies 16 are respectively bonded to the first outer lateral surface 141 and the second outer lateral surface 142.

In this arrangement, the through-holes 12c of the base body 12 described above are preferably defined at both sides of the frame body 14 in a direction intersecting the third outer lateral surface 143 and the fourth outer lateral surface 144 in a top view. Accordingly, a deformation of the base body 12 during screwing can be prevented. In other words, when the base body 12 is screwed to a heat sink or the like, a screw allows a periphery of the through-holes 12c to sink downward and, relatively, a portion between the through-holes 12c to rise upward. When a degree of such deformation of the base body 12 is increased, the frame body 14 is partially separated from the base body 12, which creates gaps. With the plate bodies 16 bonded to the first outer lateral surface 141 and the second outer lateral surface 142, respectively, deformation of the base body 12 due to such screwing may be reduced.

For example, each of the first through-holes 14c is provided for each of the lead terminals 15. In the case of disposing a plurality of lead terminals 15 on one lateral surface of the frame body 14, a plurality of first through-holes 14c may be provided in the same number as that of the lead terminals 15. With this arrangement, compared with a case where a single first through-hole 14c is provided with respect to a plurality of lead terminals 15, a region in which the first through-hole 14c is not formed on the frame body 14 can be increased, so that a bonding area between the frame body 14 and the plate bodies 16 can be increased.

As shown by dashed lines in FIG. 4, the first through-holes 14c are preferably provided with a size and at a position that allows for preventing the first through-holes 14c from contacting with the lead terminals 15. With this arrangement, when the plate bodies 16 to which the lead terminal 15 is fixed is attached to the frame body 14, a position of the lead terminals 15 can be adjusted by adjusting a position of the plate bodies 16. Further, even if the position of the lead terminal 15 is deviated from a design value, each of the lead terminals 15 can be inserted into respective one of the first through-holes 14c. The first through-holes 14c can have a maximum width larger than a maximum width of the second through-holes 16a. In the case of disposing a plurality of lead terminals 15 on one lateral surface of the frame body 14, an opening of each of the first through-holes 14c can have a shape that is elongated in a direction connecting the lead terminals 15 to each other. The opening of the first through-hole 14c has a shape of, for example, a stadium shape, that is, a shape created by equally dividing an approximate circle into approximate semicircles and connecting the semicircles with an approximate rectangle disposed between the semicircles.

The frame body 14 can have a substantially uniform thickness. This allows for facilitating manufacturing of the frame body 14. The expressions "a thickness of the upper peripheral portion 14d" and "a thickness of the lower peripheral portion 14e" refer to a width in a direction perpendicular to a bending direction in a cross-sectional view. In the case where thermal expansion coefficients of the frame body 14 and that of the base body 12 are different from each other, warpage occurs when the frame body 14 is heated and bonded to the base body 12 using a bonding material such as silver solder and then cooled. In this case, the lower surface 12B of the base body 12 and an upper surface of the frame body 14 are preferably planarized by polishing or the like so that these surfaces are flat surface or approximately flat surfaces. For example, the lower surface 12B that is warped such that a central portion thereof has a height greater than that of an outer peripheral part thereof is polished using a polishing plate until the height of the central part and the height of the outer peripheral part become similar. Accordingly, the lower surface 12B can be planarized, which allows the lower surface 12B to be more easily fixed to a heat sink, etc. In a similar manner, planarizing the upper surface of the frame body 14 allows the upper surface to be more easily bonded to the cover 80. Planarizing the frame body 14 including the upper peripheral portion 14d allows a thickness of the upper peripheral portion 14d to become uneven. For example, in the case where the frame body 14 having an outermost shape of a rectangular shape in a top view is planarized, the thickness of the upper peripheral portion 14d is reduced the closer to a central portion of a side of the rectangular shape. As described above, by partially thinning the upper peripheral portion 14d, the frame body 14 can be made more easily deformed compared with before the planarization process, and a strength of the frame body 14 can be improved compared with the case where a thickness of the frame body 14 is reduced to be a uniform thickness. A thickness reduced by planarization is, for example, 0.1 to 0.2 mm.

Lead Terminal 15

The lead terminals 15 serve to electrically connect the light-emitting element 30 to the outside. The lead terminals 15 are fixed to the plate bodies 16 via the fixing members 17. The lead terminals 15 are not provided on the lower surface 12B of the base body 12, so that substantially an entire surface of the lower surface 12B of the base body 12 can serve as a heat dissipation surface.

Accordingly, the light-emitting device 1 with good heat dissipation can be provided even in the case where a plurality of the light-emitting elements 30 that serve as a heat source is disposed on a single package 10. Examples of a material of the lead terminals 15 include KOVAR® and iron-nickel alloys. For example, the lead terminals 15 are made of metal.

Figure 5:
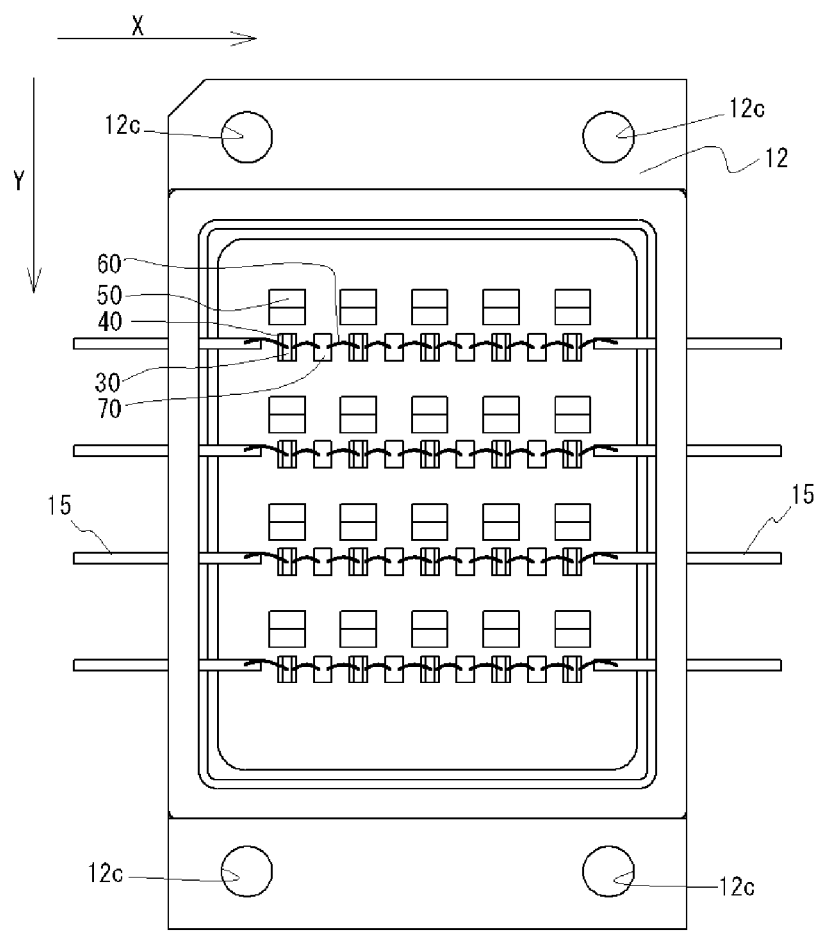
FIG. 5 is a schematic plan view showing a state where light-emitting elements are arranged on a package.

For the lead terminals 15, a plurality of pairs of a single anode side terminal and a single cathode side terminal are preferably provided. With this arrangement, as shown in FIG. 5, a plurality of arrays of the light-emitting elements 30 connected in series can be provided.

In the lead terminals 15, each of the pairs of the anode side terminal and the cathode side terminal can be disposed such that the anode side terminal and the cathode side terminal penetrate different lateral surfaces of the frame body 14, respectively. In the package 10, as shown in FIGS. 2A and 2B, a single anode-side lead terminal 15 and a single cathode-side lead terminal 15 are disposed in a straight line.

Plate Body 16

In the light-emitting device 1, the plate bodies 16 are bonded to the outer lateral surfaces 14A of the frame body 14. More specifically, the plate bodies 16 are bonded to portions of the outer lateral surfaces 14A of the frame body 14. The plate body 16 is not limited to be connected only to the outside surface 14A of the frame body 14. Rather, each of the plate bodies 16 may be bonded to at least one of the outer lateral surface 14A and the inner lateral surface 14B of the frame body 14.

The second through-holes 16a are defined in each of the plate bodies 16, and the lead terminals 15 are inserted into the second through-holes 16a. A penetrating direction of the second through-holes 16a is the same as the penetrating direction of the first through-holes 14c. In this case, the expression "the penetrating direction of the first through-holes 14c and the penetrating direction of the second through-holes 16a is the same" refers to that, in a state where the plate bodies 16 are bonded to the frame body 14, each of the first through-holes 14c is connected to each of the second through-holes 16a, and each single lead terminal 15 can be inserted into both each of the first through-holes 14c and each of the second through-holes 16a. In each of the plate bodies 16, an inner wall defining each of the second through-holes 16a may have an inclination angle with respect to a main surface thereof may differ from an inclination angle of an inner wall of the first through-hole 14c with respect to a main surface (i.e., the outer lateral surface 14A or the inner lateral surface 14B) of the frame body 14. On the other hand, in the package 10, these inclination angles are both vertical and equal to each other.

Each of the second through-holes 16a is preferably provided for each of the lead terminals 15. Accordingly, a space between each of the lead terminals 15 and each of the plate bodies 16 can be reliably sealed with the fixing member 17. In the package 10, plate bodies 16 are bonded to two opposing outer lateral surfaces of the frame body 14, respectively, a plurality of second through-holes 16a are defined in each of the plate bodies 16, and lead terminals 15 are respectively arranged in each of the second through-holes 16a. For example, each of the second through-holes 16a have an opening in a surface with a greatest area among the surfaces of each of the plate bodies 16.

Each of the plate bodies 16 has a thickness larger than that of the frame body 14. An example of a specific range of the thickness of each of the plate bodies 16 is around 1.0 to 3.0 mm. With the thickness of each plate body 16 of 1.0 mm or more, the lead terminal 15 can be fixed more firmly and the package 10 can be obtained in which a gap connecting one opening to another opening of the second through-hole 16a is less likely to be created. For example, the thickness of each plate body 16 is twice the thickness of the frame body 14 or more. In this case, the "thickness of each of the plate bodies 16" refers to a thickness of each of the plate bodies in the direction of penetration of the second through-holes 16a. In the package 10, the thickness of each of the plate bodies 16 is equal to a shortest distance between one opening and the other opening of each of the second through-holes 16a. Examples of a material of the plate bodies 16 include metal materials such as KOVAR®. It is preferable that each of the plate bodies 16 does not have a bent shape similar to that of the upper peripheral portion 14d of the frame body 14 and the like. With such a shape, the plate bodies 16 can be easily manufactured. For example, each of the plate bodies 16 has a substantially rectangular parallelepiped shape. In other words, the shape of the plate body 16 may be a rectangular parallelepiped or a shape created by rounding one or more corners of a rectangular parallelepiped shape. The plate bodies 16 and the frame body 14 are bonded using a bonding material such as silver solder. The plate bodies 16 may be bonded to the base body 12. Accordingly, even if the frame body 14 partially separated from the base body 12 and a gap is created, the gap is unlikely to connect the inside and the outside of a sealed space. The plate bodies 16 and the base body 12 are bonded using a bonding material such as silver solder.

Fixing Member 17

An inside of each of the second through-holes 16a of each of the plate bodies 16 is filled with the fixing member 17 to fix each of the lead terminals 15. In the case where the plate bodies 16 are made of a conductive material such as metal, the fixing member 17 is made of an insulating material. For example, the fixing member 17 is made of a glass material. In order to hermetically seal the light-emitting elements 30, a material with a thermal expansion coefficient that is relatively close to those of the plate bodies 16 and the lead terminals 15 is preferably used for the fixing member 17. Examples of such a material include borosilicate glass. In the package 10, the fixing member 17 is pressure-joined with the each of the plate bodies 16 and each of the lead terminals 15.

Light-Emitting Element 30

FIG. 5 is a schematic plan view showing a state where the light-emitting elements 30 are arranged on the base body 12. As shown in FIG. 5, the light-emitting elements 30 are mounted on the upper surface 12A of the base body 12. The expression "the light-emitting element 30 are mounted on the upper surface 12A" includes not only the case where the light-emitting elements 30 are directly bonded to the upper surface 12A but also the case where the light-emitting elements 30 are fixed to the upper surface 12A via another member. In the light-emitting device 1, as shown in FIG. 1D, submounts 40 are fixed to the upper surface 12A and each of the light-emitting elements 30 is fixed to each of the submounts 40.

The light-emitting device 1 may include a plurality of light-emitting elements 30. The larger the number of the light-emitting elements 30 included in the light-emitting device 1 is, the larger an amount of heat generation when being driven is, and the larger a stress due to temperature change is applied. However, with a structure in which the plate bodies 16 each having a greater thickness are provided in addition to the frame body 14 and the lead terminals 15 are fixed to the plate bodies 16 as described above, a possibility of a decrease in airtightness can be reduced even in the light-emitting device 1 having large amount of heat generation. For example, the number of the light-emitting elements 30 is four or more and can be in a range of 4 to 40.

More specifically, in the light-emitting device 1, the plurality of light-emitting elements 30 are arranged in a matrix pattern in a row direction (i.e., an X direction in FIG. 5) and a column direction (i.e., a Y direction in FIG. 5). In the case of arranging the light-emitting elements 30 via the submount 40, a material having a thermal expansion coefficient between that of the base body 12 and that of the light-emitting elements 30 can be used for a material of the submount 40. Accordingly, stress generated due to a temperature change can be reduced.

In the light-emitting device 1, the light-emitting elements 30 are semiconductor laser elements. Examples of semiconductor laser elements include those including an active layer made of a nitride semiconductor. In the case of using such semiconductor laser elements, emitted laser light is likely to cause dust accumulation, and thus the semiconductor laser element is preferably hermetically sealed. With the light-emitting device 1, a decrease in airtightness can be prevented, so that dust accumulation can be reduced. Examples of a nitride semiconductor include group III-V semiconductors such as $Al_xIn_yGa_{1-x-y}N$ ($0 \leq x \leq 1$, $0 \leq y \leq 1$, $0 \leq x+y \leq 1$). For example, each of the semiconductor laser elements includes a substrate, a semiconductor stack in which an n-type semiconductor layer, an active layer, and a p-type semiconductor layer are layered on the substrate in this order, an n-electrode electrically connected to the n-type semiconductor layer, and a p-electrode electrically connected to the p-type semiconductor layer.

Each of the plurality of semiconductor laser elements emits laser light. The laser light emitted from each semiconductor laser elements is extracted to the outside from the cover 80 either directly or via a mirror 50 or the like. A phosphor-containing member may be arranged on an optical path of a laser light to extract fluorescence excited by the laser light to the outside. For example, semiconductor laser elements with a high output of 1 W or higher are used for the light-emitting elements 30. In the case where a plurality of such a high-output semiconductor laser elements are arranged, a material with high thermal conductivity such as a copper alloy is preferably used for the base body 12. Although such a material has a large thermal expansion coefficient and stress caused by a temperature change is tend to be increased, in the light-emitting device 1, airtightness is less likely to decrease even if relatively large stress is applied. Therefore, the light-emitting device 1 including a plurality of high-output semiconductor laser elements can be realized.

The plurality of light-emitting elements 30 can be electrically connected to each other by wires 60 or the like. For the wires 60, gold, copper, aluminum, or the like can be used. For a connecting manner, for example, a plurality of light-emitting elements 30 disposed in the row direction (i.e., the X direction in FIG. 5) can be directly connected using the wires 60.

In FIG. 5, the plurality of light-emitting elements 30 in each row are arranged on a straight line and intermediate members 70 are each disposed between adjacent light-emitting elements 30. Further, adjacent light-emitting elements 30 are electrically connected to each other by the wires 60 via each of the intermediate members 70. With this arrangement, a length of each wire 60 can be relatively shortened, so that an increase in electric resistance can be prevented. Furthermore, a distance between adjacent light-emitting elements 30 can be increased in each row, so that thermal interference between the light-emitting elements 30 can be reduced. For each of the intermediate members 70, a metal member such as iron, iron alloys, or copper may be used, or an insulating member such as AlN, SiC, or SiN and an electric wiring formed on an upper surface thereof may be used. The light-emitting elements 30 are not arranged on the intermediate members 70. Each of the intermediate members 70 preferably has an upper surface positioned at a height substantially the same as that of an upper surface of each of the submounts 40 or an upper surface of each of the light-emitting elements 30. With this arrangement, the wires 60 can be easily connected to the respective components.

Mirror 50

As shown in FIG. 5, the light-emitting device 1 may further include mirrors 50. In this case, the light-emitting elements 30 are semiconductor laser elements. The mirrors 50 are arranged such that a light-emitting surface of each of the semiconductor laser elements to emit a laser light faces an inclined surface of respective one of the mirrors 50. A plurality of mirrors each elongated in the row direction (i.e., the X direction in FIG. 5) may be arranged in column, or a plurality of mirrors 50 may be arranged in a matrix pattern corresponding to the semiconductor laser elements. Each of the mirrors 50 includes a reflecting surface to reflect a laser light emitted by the semiconductor laser element. Each of the mirrors 50 includes, for example, a base including a mounting surface and an inclined surface inclined with respect to the mounting surface, and a reflective film disposed on the inclined surface of the base. Glass, synthetic quartz, silicon, sapphire, aluminum, or the like can be used for the base of the mirror 50, and a metal film, a dielectric multilayer film, or the like can be used for the reflective film of the mirror 50.

Cover 80

The cover 80 is bonded to the frame body 14. Accordingly, the light-emitting element 30 can be hermetically sealed. The cover 80 includes a transmissive member 84 for extracting light from the light-emitting element 30 to the outside. As shown in FIGS. 1A to 1D, the cover 80 includes a main body portion 82 having a plurality of windows 82a and the transmissive member 84. The plurality of windows 82a are each provided at a position from which light emitted by respective one of the plurality of light-emitting elements 30 (for example, laser light emitted by each of the semiconductor laser elements) can be extracted.

For the main body portion 82, glass, metal, ceramics, or a material combining these materials can be used and, preferably, a metal is used. Using metal for the main body section 82 allows the frame body 14 and the cover 80 to be fixed to each other by welding or the like, so that hermetic sealing can be easily achieved. For the transmissive member 84, a member that transmits at least a portion of light emitted inside a sealed space enclosed by the package 10 and the cover 80 is used. For example, a member configured to transmit light emitted by the light-emitting element 30 is used. In the case of arranging a phosphor-containing member to be excited by light emitted by the light-emitting element 30, a member configured to transmit at least fluorescence from the phosphor-containing member is used for the transmissive member 84.

The main body portion 82 may include one window 82a with respect to two or more light-emitting elements 30, but it is preferable that the main body portion 82 includes windows 82a such that each of the windows corresponds to a respective one of the plurality of light-emitting elements 30. With this arrangement, a bonding area between the main body portion 82 and the transmissive member 84 can be comprehensively increased, so that cracking of the transmissive member 84 due to stress can be reduced.

In the light-emitting device 1, a lens member including a lens portion may be further arranged on the cover 80. The cover 80 can have a structure that also functions as the lens member. However, in the case where the cover 80 is fixed to the frame body 14 by welding, the welding may cause displacement, so that it is difficult to arrange the lens portion at a designed position. In order to seal a space in which the light-emitting elements 30 are arranged, a member that covers the package 10 is preferably fixed by welding. Accordingly, the cover 80 and the lens member are preferably provided as separate members. With this arrangement, while the cover 80 can be fixed to the frame body 14 by welding, the lens member can be fixed to the cover 80 using an adhesive or the like. Accordingly, displacement of the lens member can be reduced while the space in which the light-emitting elements 30 are arranged can be sealed using the cover 80.

While certain embodiments have been described above, it is to be understood that the scope of the present invention is not limited to the description of those embodiments.

What is claimed is:

1. A light-emitting device comprising:
   a base body including an upper surface and a lower surface;
   one or more light-emitting elements mounted on the upper surface of the base body;
   a frame body including one or more inner lateral surfaces, one or more outer lateral surfaces, one or more first through-holes that extend through the frame body in a lateral direction so as to connect an inside and an outside of the frame body, and a lower peripheral portion that is bent inward or outward and bonded to the upper surface of the base body so as to surround the one or more light-emitting elements;
   one or more lead terminals, each of which extends through a respective one of the one or more first through-holes, and each of which is electrically connected to the one or more light-emitting elements;
   a cover bonded to the frame body so as to seal the one or more light-emitting elements;
   one or more plate bodies, each of which is bonded to a respective one of the one or more outer lateral surfaces or a respective one of the one or more inner lateral surfaces of the frame body, each of the one or more plate bodies having one or more second through-holes that extend through the plate body in the lateral direction, wherein each of the one or more lead terminals extends through a respective one of the one or more second through-holes; and
   one or more fixing members, each of which is disposed in a respective one of the one or more second through-holes and fixes a respective one of the one or more lead terminals in a respective one of the one or more plate bodies.

2. The light-emitting device according to claim 1, wherein:
   the base body has a protrusion that protrudes upward and a bonding surface around the protrusion, and
   the frame body is bonded to the bonding surface of the base body.

3. The light-emitting device according to claim 2, wherein the one or more light-emitting elements are mounted on the protrusion.

4. The light-emitting device according to claim 2, wherein the protrusion is spaced from the frame body.

5. The light-emitting device according to claim 1, wherein:
   the frame body includes an upper peripheral portion that is bent inward or outward above the one or more plate bodies, and
   the cover is bonded to the upper peripheral portion of the frame body.

6. The light-emitting device according to claim 5, wherein the upper peripheral portion is spaced from the one or more plate bodies.

7. The light-emitting device according to claim 5, wherein:
the upper peripheral portion is bent outward, and
at least one of the one more plate bodies is bonded to at least one of the one or more outer lateral surface of the frame body.

8. The light-emitting device according to claim 1, wherein:
the frame body has a substantially rectangular outer shape in a top view, and the one or more outer lateral surfaces comprise a first outer lateral surface, a second outer lateral surface on an opposite side to the first outer lateral surface, a third outer lateral surface, and a fourth outer lateral surface on an opposite side to the third outer lateral surface, and
the one or more plate bodies comprise a first plate body connected to the first outer lateral surface and a second plate body connected to the second outer lateral surface.

9. The light-emitting device according to claim 1, wherein each of the one or more light-emitting elements is a semiconductor laser element.

10. The light-emitting device according to claim 9, wherein the semiconductor laser element includes an active layer made of a nitride semiconductor.

11. The light-emitting device according to claim 9, wherein the one or more light-emitting elements comprise a plurality of semiconductor laser elements mounted on the upper surface of the base body.

12. The light-emitting device according to claim 1, wherein each of the one or more plate bodies is made of one or more metals.

13. A package for a light-emitting device, the package comprising:
a base body including an upper surface and a lower surface;
a frame body including one or more inner lateral surfaces, one or more outer lateral surfaces, one or more first through-holes that extend through the frame body in a lateral direction so as to connect an inside and an outside of the frame body, and a lower peripheral portion that is bent inward or outward and bonded to the upper surface of the base body;
one or more lead terminals, each of which extends through a respective one of the one or more first through-holes;
one or more plate bodies, each of which is bonded to a respective one of the one or more outer lateral surfaces or a respective one of the one or more inner lateral surfaces of the frame body, each of the one or more plate bodies having one or more second through-holes that extend through the plate body in the lateral direction, wherein each of the one or more lead terminals extends through a respective one of the one or more second through-holes; and
one or more fixing members, each of which is disposed in a respective one of the one or more second through-holes and fixes a respective one of the one or more lead terminals in a respective one of the one or more plate bodies.

14. The package for a light-emitting device according to claim 13, wherein:
the base body has a protrusion that protrudes upward and a bonding surface around the protrusion, and
the frame body is bonded to the bonding surface of the base body.

15. The package for a light-emitting device according to claim 14, wherein the protrusion is spaced from the frame body.

16. The package for a light-emitting device according to claim 13, wherein:
the frame body includes an upper peripheral portion that is bent inward or outward above the one or more plate bodies, and
the cover is bonded to the upper peripheral portion of the frame body.

17. The package for a light-emitting device according to claim 16, wherein the upper peripheral portion is spaced from the one or more plate bodies.

18. The package for a light-emitting device according to claim 16, wherein:
the upper peripheral portion is bent outward, and
at least one of the one more plate bodies is bonded to at least one of the one or more outer lateral surface of the frame body.

19. The package for a light-emitting device according to claim 13, wherein:
the frame body has a substantially rectangular outer shape in a top view, and the one or more outer lateral surfaces comprise a first outer lateral surface, a second outer lateral surface on an opposite side to the first outer lateral surface, a third outer lateral surface, and a fourth outer lateral surface on an opposite side to the third outer lateral surface, and
the one or more plate bodies comprise a first plate body connected to the first outer lateral surface and a second plate body connected to the second outer lateral surface.

20. The package for a light-emitting device according to claim 13, wherein each of the one or more plate bodies is made of one or more metals.

* * * * *